(12) United States Patent  
Lai et al.

(10) Patent No.: US 8,596,200 B2  
(45) Date of Patent: Dec. 3, 2013

(54) BIDIRECTIONAL WAFER CARRYING POD AND WAFER TRANSFER SYSTEM

(75) Inventors: Jung-Pin Lai, New Taipei (TW); Tsan-I Chen, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 199 days.

(21) Appl. No.: 13/210,533

(22) Filed: Aug. 16, 2011

(65) Prior Publication Data

US 2012/0325105 A1 Dec. 27, 2012

(30) Foreign Application Priority Data

Jun. 22, 2011 (TW) .............................. 100121813 A

(51) Int. Cl.
  *B61B 3/00* (2006.01)
  *E01B 25/26* (2006.01)

(52) U.S. Cl.
  USPC .......................................... 104/89; 206/710

(58) Field of Classification Search
  USPC .......................................... 104/89; 206/710
  See application file for complete search history.

(56) References Cited

U.S. PATENT DOCUMENTS

| | | | | |
|---|---|---|---|---|
| 5,253,755 A | * | 10/1993 | Maenke | 206/308.3 |
| 5,816,415 A | * | 10/1998 | Ahn et al. | 211/41.18 |
| 7,461,598 B2 | * | 12/2008 | Shiwaku | 104/88.01 |
| 7,578,240 B2 | * | 8/2009 | Shiwaku | 104/89 |
| 2010/0038281 A1 | * | 2/2010 | Lin et al. | 206/710 |
| 2010/0116709 A1 | * | 5/2010 | Liu | 206/710 |

* cited by examiner

*Primary Examiner* — Zachary Kuhfuss
(74) *Attorney, Agent, or Firm* — Rosenberg, Klein & Lee

(57) ABSTRACT

A wafer transfer system includes a bidirectional wafer carrying pod, an over-head transport (OHT) rail, an OHT, two platforms, and two loading ports respectively connected to the two platforms. The bidirectional wafer carrying pod has a loading housing and two doors respectively and detachably installed on the two opposite sides of the loading housing. The OHT rail has a single rail section and a double rail section. The two ends of the double rail section are connected to the single rail section. The platforms are respectively disposed beside the double rail section. The loading ports are disposed under the double rail section. Through the OHT, The bidirectional wafer carrying pod can selectively be transferred to one rail of the double rail section and disposed on the loading port of the tool corresponding to the one rail of the double rail section.

9 Claims, 6 Drawing Sheets

BIDIRECTIONAL WAFER CARRYING POD AND WAFER TRANSFER SYSTEM

BACKGROUND OF THE INVENTION

1. Field of the Invention

The present invention relates to a bidirectional storage device and transfer system; in particular, to a bidirectional storage device and transfer system for transferring wafer.

2. Description of Related Art

Prior art wafer transfer system, such as shown in FIGS. 1 and 2, includes: a front opening unified pod 1a (FOUP), a single rail over-head transport (OHT) 2a, a transport 3a that is placed movably on the single rail OHT 2a, two platforms 4a that are located at the sides of the single rail OHT 2a, and two loading ports respectively connected to the two tool 4a and located at the bottom of the single rail OHT 2a. Thereby, the transport 3a transfers the FOUP 1a to the predetermined loading port 5a through the single rail OHT 2a.

However, because the single rail OHT 2a of the prior art wafer transfer system needs to cooperate with the FOUP 1a, therefore only one path may be designed and the path passes through the overhead of the two loading ports 5a in sequence. In other words, the single rail OHT 2a must first pass through one loading port 5a, then pass through the other loading port 5a. Therefore, more time is required when the transport 3a transfers the FOUP 1a to the other loading port 5a.

Furthermore, because the single rail OHT 2a requires a turnabout section 21a with a fixed radius of turn, therefore the distance $D_0$ is greater between the single rail OHT 2a that extends from the two ends of the turnabout section 21a, and so requires a wider space for operation.

SUMMARY OF THE INVENTION

The object of the present invention is to provide a bidirectional wafer carrying pod and wafer transfer system, which can reduced wafer transferring time to the a tool, and takes up less space for operation.

In order to achieve the aforementioned objects, according to an embodiment of the present invention, a wafer transfer system is provided, including: a bidirectional wafer carrying pod, includes a loading housing and two doors respectively and detachably installed on the two opposite sides of the loading housing; an over-head transport (OHT) rail, includes a single rail section and a double rail section that is installed with separation interval, the double rail section has two sub-tracks, the two ends of the double rail section respectively overlaps and connects to the single rail section; an OHT, for transferring the bidirectional wafer carrying pod, movably installed on the OHT rail; and two platforms, respectively disposed beside the double rail section, the two tool each installed with at least one loading port, and the loading ports for the two platforms are respectively located at the bottom of the double rail section; wherein, the bidirectional wafer carrying pod can be selectively transferred to one of the sub-tracks of the double rail section through the OHT, and disposed on the loading port of the tool corresponding to the last mentioned sub-track of the double rail section.

A bidirectional wafer carrying pod is further provided according to an embodiment of the present invention, including: a base plate; a loading housing, installed on the base plate, the two opposite sides of the loading housing forms two opening ends; and two doors, respectively and detachably installed on the opening ends of the two opposite sides of the loading housing.

Per aforementioned, the bidirectional wafer carrying pod and wafer transfer system according to the embodiment of the present invention can reduce the time required for transfer to the loading port, and effectively reduce the required space for operation.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

[The First Embodiment]

Figure 3:
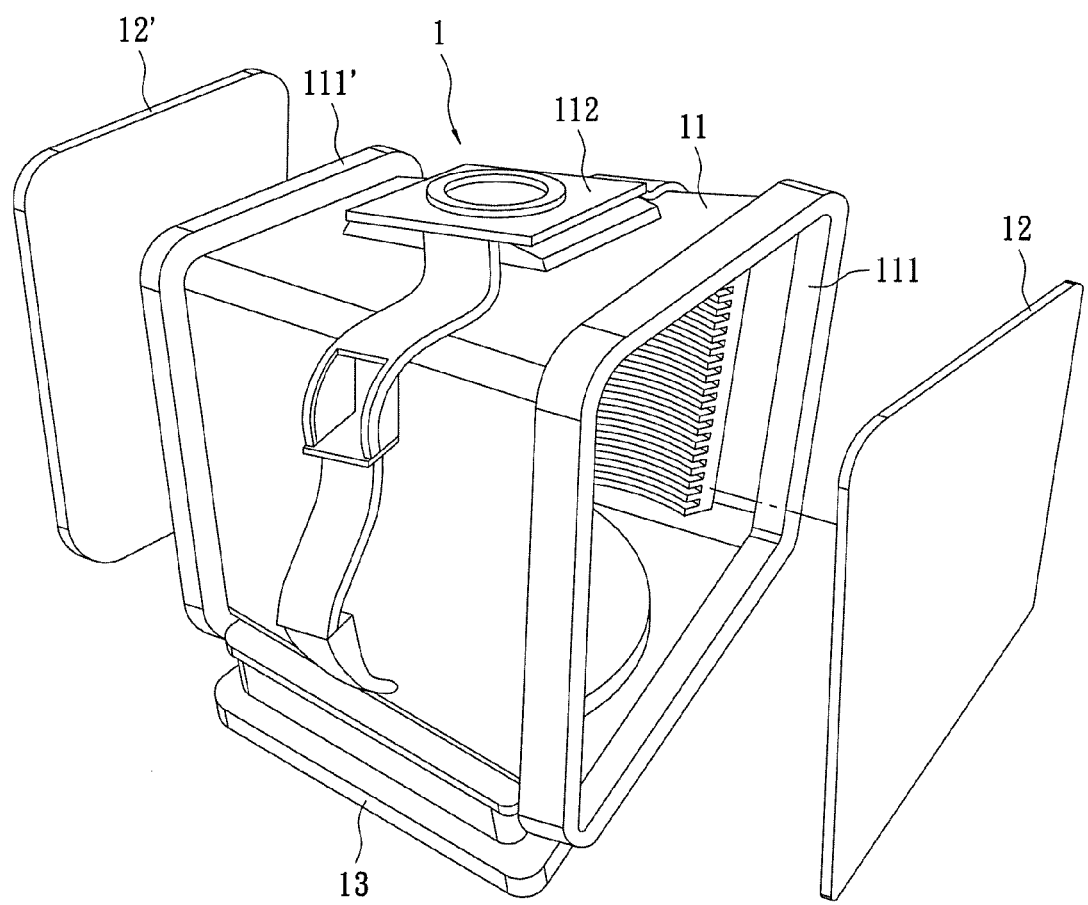
FIG. 3 shows a perspective diagram according to a first embodiment of the present invention.
Figure 4:
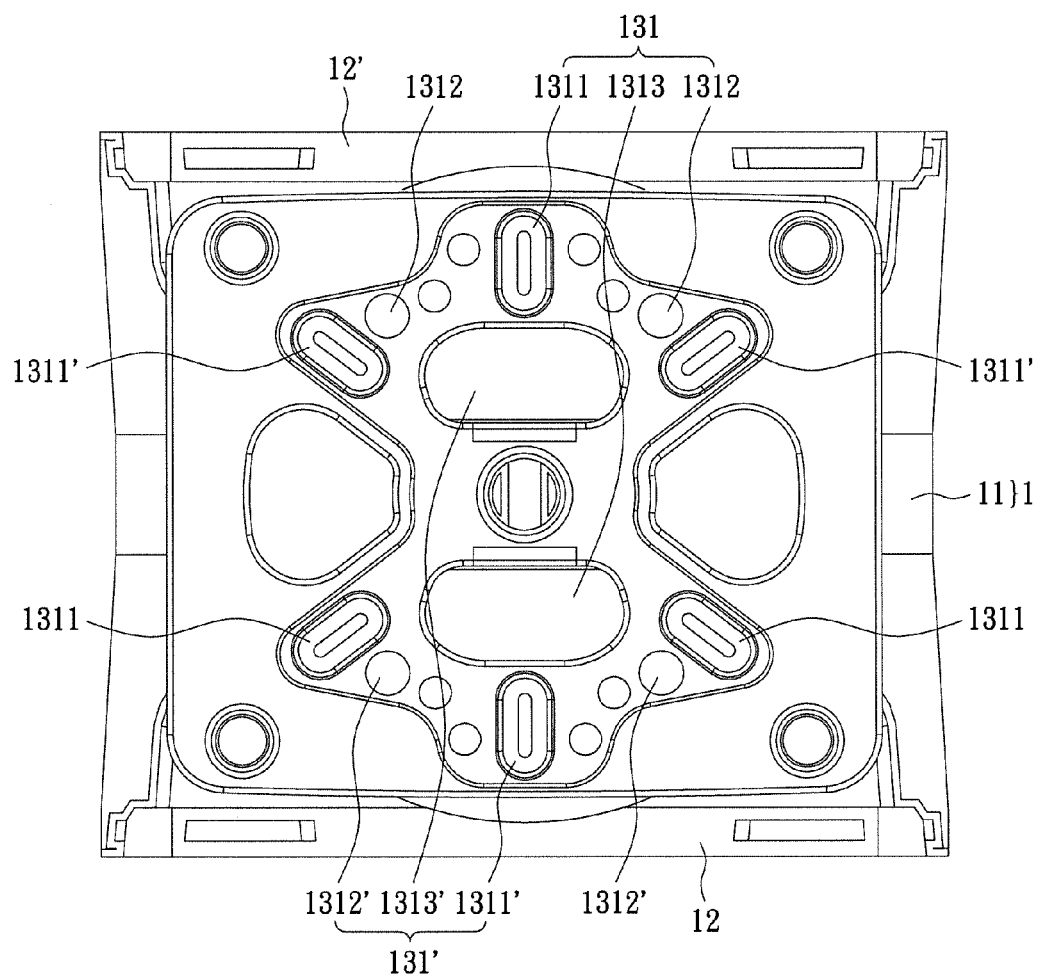
FIG. 4 shows a plane view schematic diagram according to the first embodiment of the present invention.

Refer to FIGS. 3 and 4, which shows the first embodiment of the present invention, wherein FIG. 3 shows a perspective diagram according to the present embodiment, and FIG. 4 shows a plane view schematic diagram according to the present embodiment.

The present embodiment is a bidirectional wafer carrying pod 1, including: loading housing 11, two doors 12, 12', and base plate 13. Therein, the two doors 12, 12' are respectively installed on the two opposite sides of the loading house 11, and the base plate 13 is installed at the bottom of the loading casing 11.

As shown by FIGS. 3 and 4, the aforementioned loading casing 11 is generally symmetrical in shape, and the two opposite sides of the loading housing 11 respectively forms two opening ends 111, 111', thereby the wafer can selectively enter or exit loading casing 11 through one of the two opening ends 111, 111'. Furthermore, the outside of the loading casing 11 has a coupling mechanism 112 engageable with the overhead transport vehicle, so as to transport or transfer the bidirectional wafer carrying pod 1.

The aforementioned two doors 12, 12' may be respectively and detachably installed on the opening ends 111, 111' of the two opposite sides of the loading housing 11, so that the bidirectional wafer carrying pod 1 from an enclosed shape, and the bidirectional wafer carrying pod 1 can selectively open one of the doors 12, 12' according to requirement.

The bottom of the aforementioned base plate 13 is symmetrically shaped, as shown in FIG. 4, and the bottom of the base plate 13 forms two sets of alignment structure 131, 131' that are symmetrical, the aforementioned two sets of alignment structure 131, 131' each includes a positioning part 1311, 1311', a stopping part 1312, 1312', and a fastening part 1313, 1313'. In other words, the positioning part 1311, 1311', the stopping part 1312, 1312', and the fastening part 1313, 1313' of the two set of alignment structure 131, 131' are symmetrically positioned.

The aforementioned alignment structure 131, 131' each corresponds to a door 12, 12'. In other words, no matter which door 12, 12' is used, there is a corresponding positioning part 1311, 1311', a corresponding stopping part 1312, 1312', and a corresponding fastening part 1313, 1313' (i.e. the alignment structure 131 corresponds to the door 12, the alignment structure 131' corresponds to the door 12').

Also, even though prior art FOUP also has corresponding alignment structure, but the prior art FOUP merely has a door and one corresponding positioning part, one corresponding stopping part, and one corresponding fastening part. Therein, the individual positioning parts 1311, 1311', stopping parts 1312, 1312', and fastening parts 1313, 1313' relevant to the present invention are similar in function to the prior art, a general description of the function is shown below.

The aforementioned positioning part 1311, 1311' is composed of three equally spaced elongated hole, so that the alignment pins (not shown) of the loading port can be inserted into position, thereby prevent the bidirectional wafer carrying pod 1 from being force out.

The aforementioned stopping part 1312, 1312' is a plurality of round holes, so that the door 12, 12' of the bidirectional wafer carrying pod 1 can only be opened by corresponding manufacturing tool (not shown) that is required for processing; thereby prevent the wafer within the bidirectional wafer carrying pod 1 from being mistakenly processed by the wrong manufacturing tool.

The aforementioned fastening part 1313, 1313' is an opening hole, provided for a barb (not shown) of the loading port to penetrate and fasten; thereby the bidirectional wafer carrying pod 1 can be more securely disposed on the loading port of the tool.

[The Second Embodiment]

Figure 5:
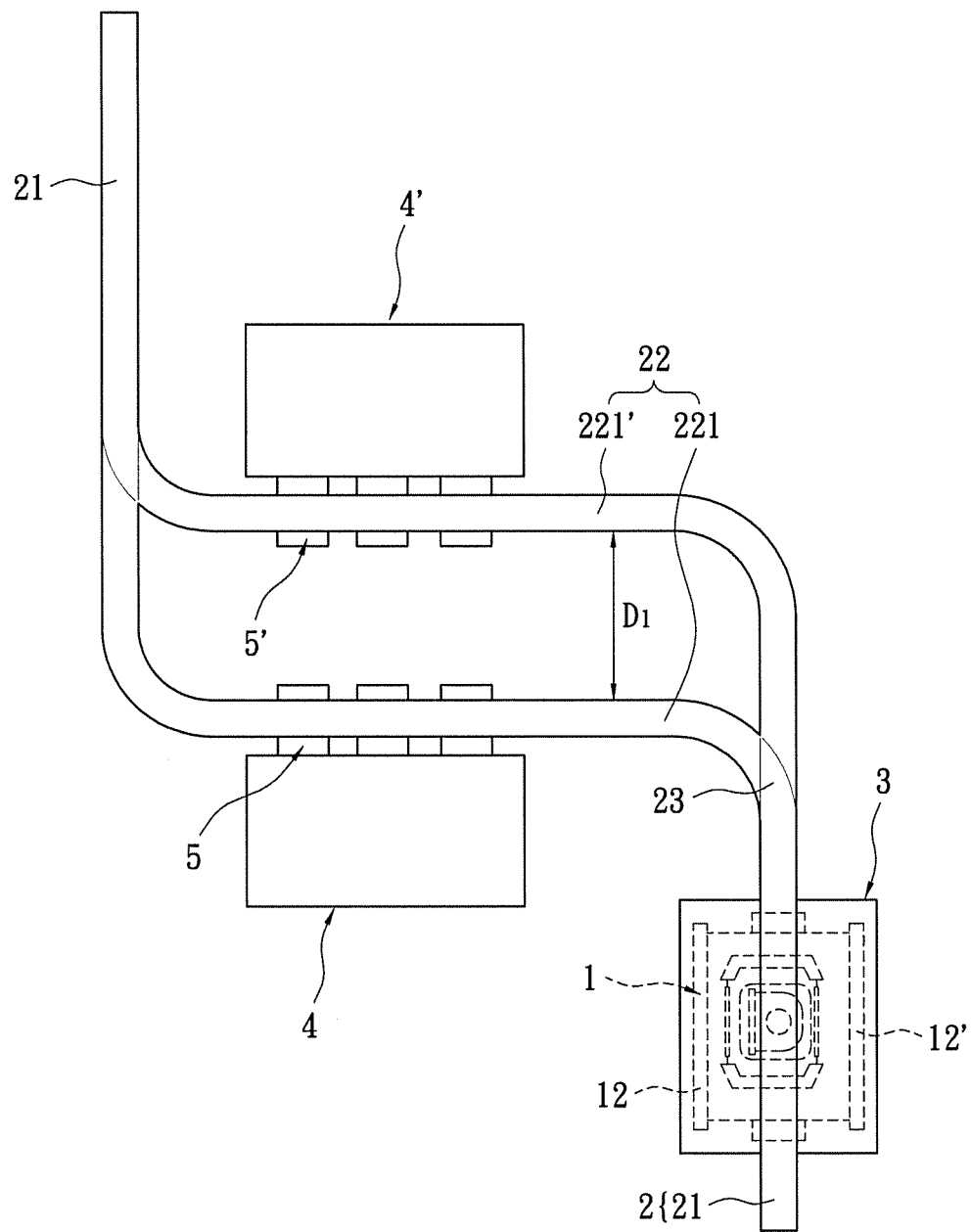
FIG. 5 shows a plane view schematic diagram according to a second embodiment of the present invention.
Figure 6:
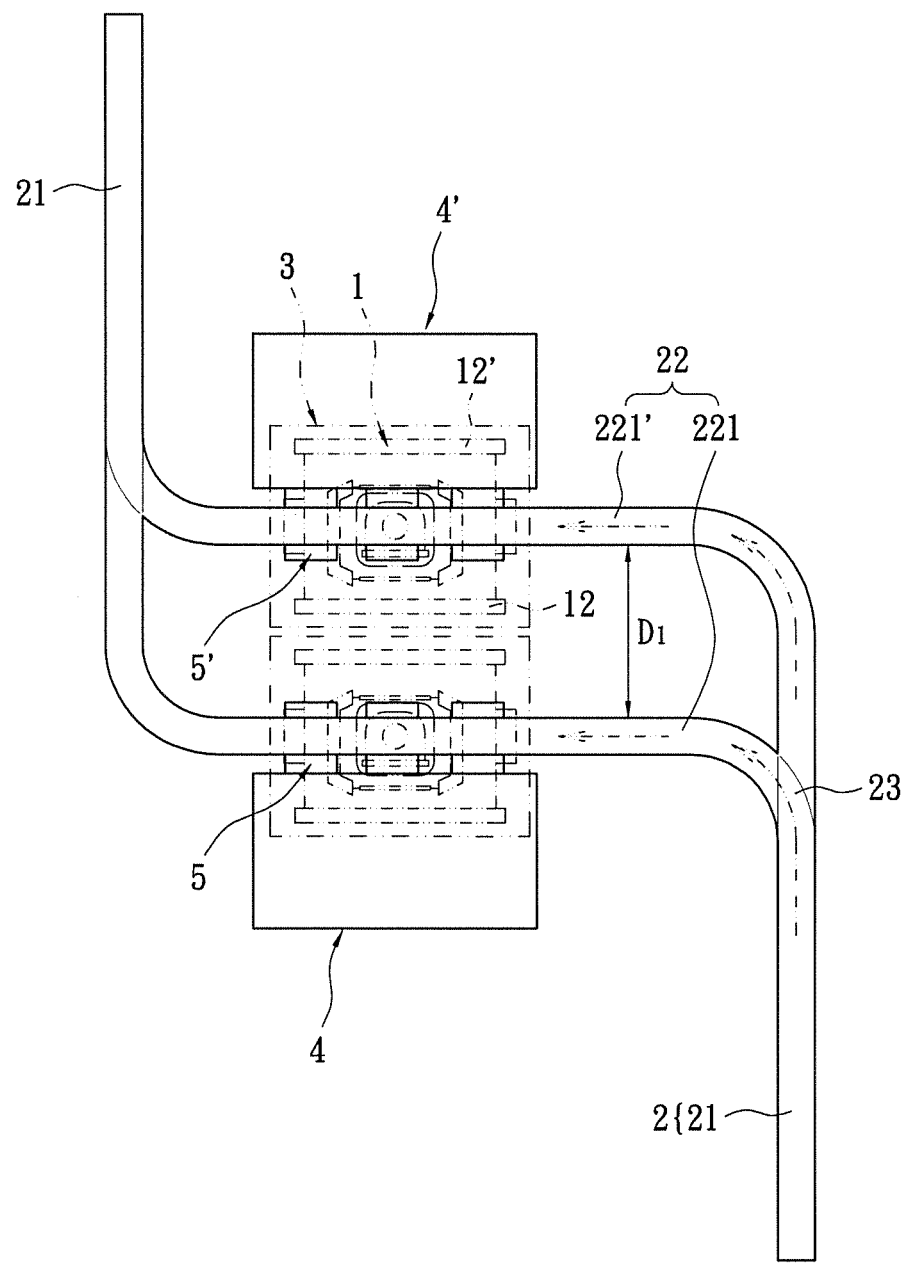
FIG. 6 shows a plane view operation diagram according to the second embodiment of the present invention.

Refer to FIGS. 5 and 6, which shows the second embodiment of the present invention, wherein FIG. 5 shows a plane view schematic diagram according to the present embodiment, and FIG. 6 shows a plane view operation diagram according to the present embodiment.

The present embodiment is a wafer transfer system, including: the bidirectional wafer carrying pod 1 as described by the first embodiment, an over-head transport (OHT) rail 2, an OHT 3 for transferring the bidirectional wafer carrying pod 1, two platforms 4, 4', and at least two loading ports 5, 5'.

The aforementioned OHT rail includes a single rail section 21 and a double rail section 22 that is installed with separation interval, more specifically the aforementioned double rail section 22 has two sub-tracks 221, 221' that forms a separation interval, and the two ends of the double rail section 22 respectively overlaps and connects to the single rail section 21. In further detail, where the two ends of the double rail section 22 that overlaps and connects to the single rail section 21 forms a divergent track junction 23 that is Y-shaped.

The OHT 3 is movably installed on the OHT rail 2, so that when the OHT 3 moves from the single rail section 21 to the divergent track junction 23, the OHT 3 can selectively move to one of the two sub-tracks 221, 221' of the double rail section 22.

The aforementioned two platforms 4, 4' are respectively disposed beside the double rail section 22, in other words, the aforementioned two platforms 4, 4' is disposed on the two opposite sides of the double rail section 22. More specifically, the two platforms 4, 4' can be respectively disposed on the outside or inside of the double rail section 22. For the present embodiment, the two platforms 4, 4' are respectively disposed at the outside of the double rail section 22, but the present invention is not limited thereby.

The aforementioned at least two loading port 5, 5' are respectively installed at the two aforementioned two platforms 4, 4', and disposed between the two platforms 4, 4', additionally the loading port 5, 5' are respectively positioned at the bottom of the two sub-tracks 221, 221' of the double rail section 22. Thereby, the bidirectional wafer carrying pod 1 can be selectively transferred by the OHT 3 to one of the loading port 5, 5' of the tool 4, 4' through the divergent track junction 23 of the OHT rail 2.

More specifically, the two doors 12, 12' of the bidirectional wafer carrying pod 1 respectively corresponds to the aforementioned two platforms 4, 4' (i.e. door 12 corresponds to tool 4, door 12' corresponds to tool 4'), so that when the bidirectional wafer carrying pod 1 is transferred to the predetermined loading port 5, 5' of the tool 4, 4', then the corresponding door 12, 12' that is nearing the tool 4, 4' can be opened, thereby the wafer within the bidirectional wafer carrying pod 1 can be retrieved by the platforms 4, 4'.

Therefore, the present invention coordinates the bidirectional wafer carrying pod 1 and the OHT rail 2 (such as the double rail section 22 and the divergent track junction 23), so that the bidirectional wafer carrying pod 1 can be transferred to the loading port 5, 5' of the tool 4, 4' in a shorter time (such that, when the bidirectional wafer carrying pod 1 is transferred to the loading port 5' of the tool 4', because the bidirectional wafer carrying pod 1 does not need to turn about, so that the time required for operation is shorter than prior art), thereby the overall work efficiency is increased, and achieves the effect of production cost reduction.

Figure 1:
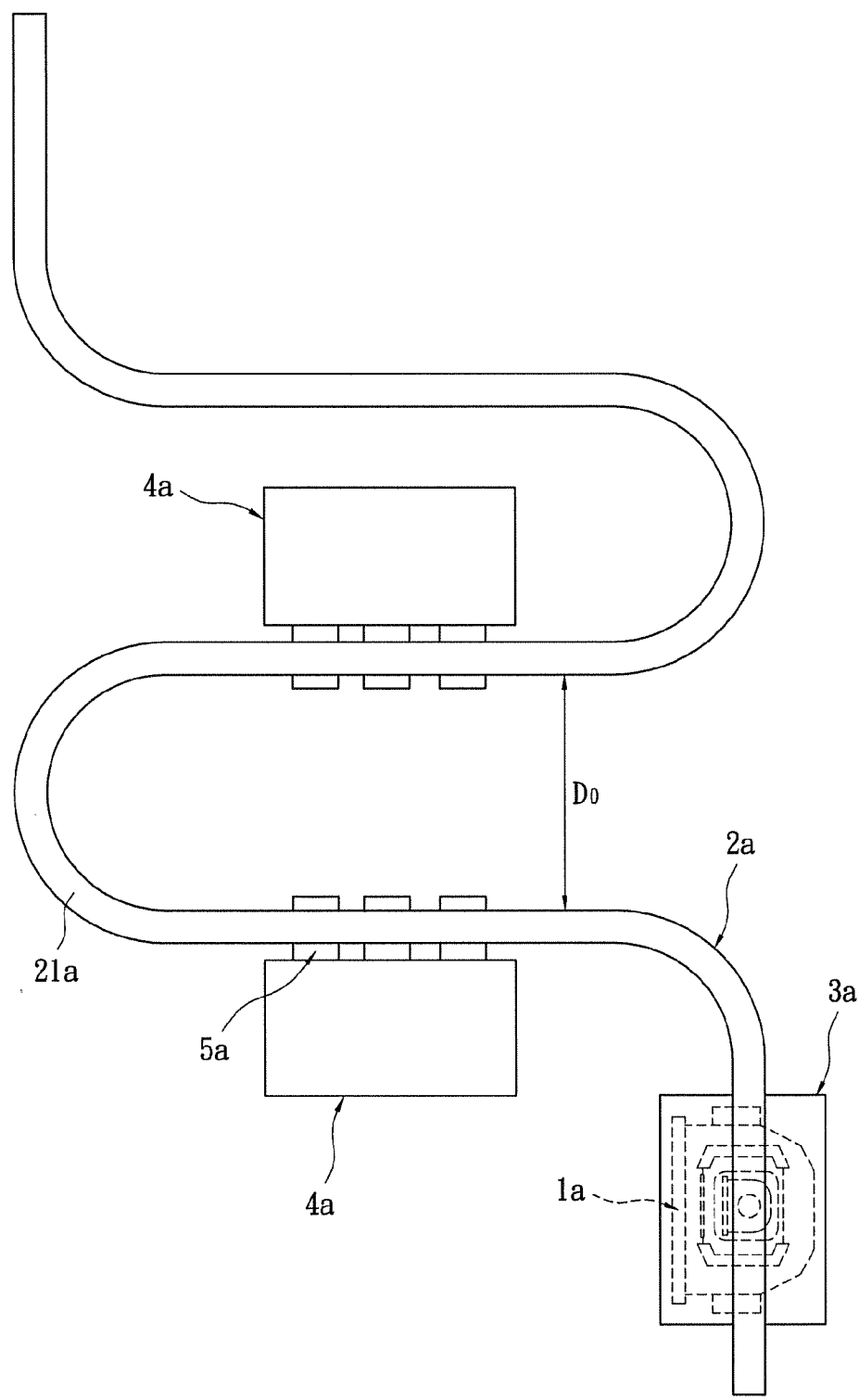
FIG. 1 shows a schematic diagram of a wafer transfer system according to prior art.
Figure 2:
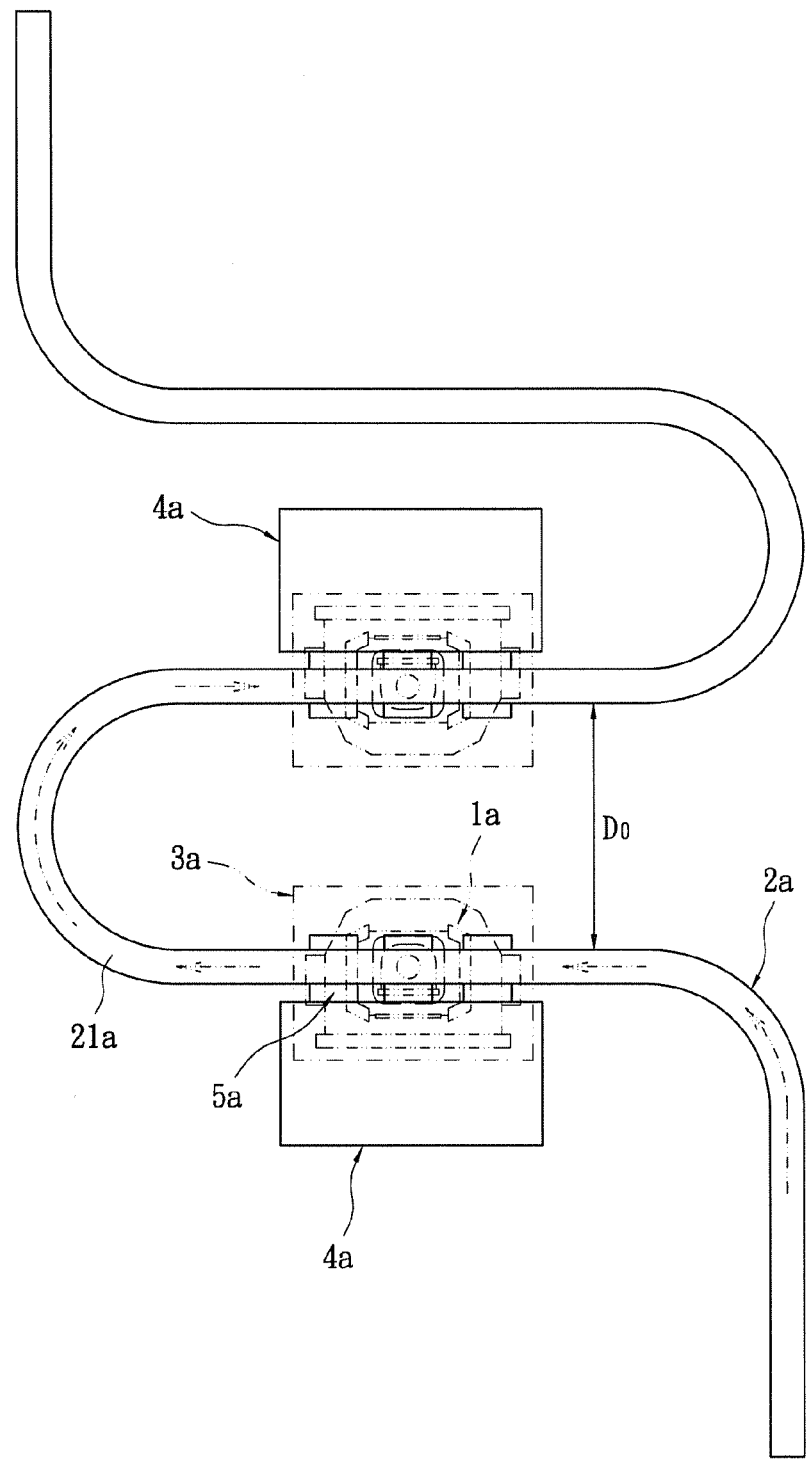
FIG. 2 shows an operation diagram of the wafer transfer system according to prior art.

Furthermore, because the wafer transfer system of the present invention utilizes the bidirectional wafer carrying pod 1, therefore the OHT rail 2 does not require a turnabout section of the prior art, thereby the distance $D_1$ of the separation interval of the double rail section 22 that is above the load orts 5, 5' of the two platforms 4, 4' is less than the distance $D_0$ (as shown in FIG. 1) that is between the single rail OHT 2a that extends from the two ends of the turnabout section 21a. In other words, the present invention effectively shortens the displacement distance from one small tool to another, thereby the required space for operation of the wafer transfer system is reduced, and so more loading ports and tool can be installed.

[Effects of the Embodiments]

According to the embodiments of the present invention, the aforementioned bidirectional wafer carrying pod 1 and wafer transfer system can reduce the time required for bidirectional wafer carrying pod 1 to transport to the selected loading port 5, 5' of the platforms 4, 4', additionally the wafer transfer system can effectively reduce the required space for operation, thereby efficiently utilizes the available space.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A wafer transfer system, comprising:
   a bidirectional wafer carrying pod, which comprises a housing and two doors respectively and detachably installed on the two opposite sides of the housing;
   an over-head transport (OHT) rail, which comprises a single rail section and a double rail section, the double rail section having two sub-tracks arranged with a predetermined separation in between, wherein the corresponding ends of the sub-tracks double rail section jointly connect to the single rail section;

an OHT vehicle movably installed on the OHT rail for transferring the bidirectional wafer carrying pod; and two platforms, each respectively arranged proximate the corresponding sub-track of the double rail section, each platform having at least one loading port, wherein the loading ports of the platforms are respectively arranged underneath the corresponding sub-tracks;

wherein, the bidirectional wafer carrying pod can be selectively transferred to one of the sub-tracks of the double rail section and disposed on the loading port of the corresponding platform double rail section.

2. The wafer transfer system according to claim 1, wherein the two platforms are disposed at the two opposite sides of the double rail section, the loading ports of the two platforms are disposed between the two platforms.

3. The wafer transfer system according to claim 1, wherein the two ends of the double rail section that overlap and connect to the single rail section form a divergent track junction.

4. The wafer transfer system according to claim 3, wherein the divergent track junction is Y-shaped.

5. The wafer transfer system according to claim 1, wherein the two doors of the bidirectional wafer carrying pod respectively corresponds to the two platforms and the loading ports of the two platforms.

6. A bidirectional wafer carrying pod, comprising:

a base plate, wherein the bottom of the base plate forms two sets of alignment structure, and the two sets of alignment structure each comprise a positioning part, a stopping part, and a fastening part;

a loading housing, installed on the base plate, the two opposite sides of the loading housing form two opening ends; and two doors, respectively and detachably installed on the opening ends of the two opposite sides of the loading housing.

7. The bidirectional wafer carrying pod according to claim 6, wherein the bottom of the base plate is symmetrically shaped.

8. The bidirectional wafer carrying pod according to claim 6, wherein the two sets of alignment structure are symmetrical.

9. The bidirectional wafer carrying pod according to claim 6, wherein the two sets of alignment structure respectively correspond to the two doors.

* * * * *